(12) United States Patent  
Kusaka et al.

(10) Patent No.: US 9,069,038 B2  
(45) Date of Patent: Jun. 30, 2015

(54) TEST APPARATUS

(71) Applicant: ADVANTEST CORPORATION, Tokyo (JP)

(72) Inventors: Takashi Kusaka, Tokyo (JP); Masahiro Ishida, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 13/781,416

(22) Filed: Feb. 28, 2013

(65) Prior Publication Data

US 2013/0229197 A1    Sep. 5, 2013

(30) Foreign Application Priority Data

Mar. 1, 2012    (JP) .................................. 2012-045860

(51) Int. Cl.
  *G01R 31/28*    (2006.01)
  *G01R 31/319*    (2006.01)
  *H02M 3/156*    (2006.01)
  *H02M 1/00*    (2007.01)

(52) U.S. Cl.
  CPC ...... *G01R 31/2832* (2013.01); *G01R 31/31924* (2013.01); *H02M 3/156* (2013.01); *H02M 2001/0019* (2013.01)

(58) Field of Classification Search
  CPC .................................................. G01R 31/3172
  See application file for complete search history.

(56) References Cited

U.S. PATENT DOCUMENTS

| 8,466,701 B2 * | 6/2013 | Kojima et al. ............. 324/750.3 |
| 8,547,265 B2 * | 10/2013 | Shimizu et al. ............... 341/142 |
| 2005/0099200 A1 | 5/2005 | Furukawa et al. |
| 2009/0059626 A1 | 3/2009 | Kanakubo |
| 2010/0066403 A1 | 3/2010 | Furukawa |

(Continued)

FOREIGN PATENT DOCUMENTS

| CN | 1310522 A | 8/2001 |
| CN | 1310522 A | 8/2001 |

(Continued)

OTHER PUBLICATIONS

Office action dated Jan. 28, 2014 from corresponding South Korean Patent Application No. 10-2013-0022214 and its English summary provided by the clients.

(Continued)

*Primary Examiner* — Arleen M Vazquez  
*Assistant Examiner* — Feba Pothen  
(74) *Attorney, Agent, or Firm* — Ladas & Parry, LLP

(57) ABSTRACT

A main power supply is arranged such that its output terminal Po is connected to a power supply terminal of a DUT via a power supply line, and is configured to feedback control an output voltage $V_{OUT}$ output from the output terminal such that a detection value $V_{DD}'$ that corresponds to a power supply voltage $V_{DD}$ at the power supply terminal approaches a target value $V_{REF}'$. When a test pattern is supplied to the DUT, a power supply control unit is configured to feedforward control the main power supply such that the power supply voltage $V_{DD}$ approaches a predetermined target waveform $V_{TGT}$.

16 Claims, 10 Drawing Sheets

(56) References Cited

U.S. PATENT DOCUMENTS

2011/0074497 A1  3/2011  Kojima et al.
2011/0181308 A1* 7/2011  Ishida et al. ............. 324/750.02
2011/0309960 A1  12/2011 Shimizu et al.

FOREIGN PATENT DOCUMENTS

| | | | |
|---|---|---|---|
| CN | 101057198 | A | 10/2007 |
| CN | 101057198 | A | 10/2007 |
| CN | 102132165 | A | 8/2011 |
| CN | 102132165 | A | 8/2011 |
| CN | 102150054 | A | 8/2011 |
| CN | 102150054 | A | 8/2011 |
| JP | 2007-205813 | | 8/2007 |
| JP | 2012-002666 | | 1/2012 |
| KR | 10-2011-0063534 | | 6/2011 |
| WO | 2010/029709 | A1 | 3/2010 |

OTHER PUBLICATIONS

Office action dated Oct. 27, 2014 from corresponding TW Patent Application No. 102105742 and its English summary provided by the applicants.

Office action dated Dec. 31, 2014 from corresponding Chinese Patent Application No. 201310064591.4 and its English summary provided by the client.

Office action dated Oct. 27, 2014 from corresponding Tan Patent Application No. 102105742 and its English summary provided by the applicants.

* cited by examiner

TEST APPARATUS

CROSS-REFERENCE TO RELATED APPLICATIONS

This application claims priority to Japanese Patent Application No. 2012-045860 filed on Mar. 1, 2012, the disclosure of which is incorporated herein by reference in its entirety.

BACKGROUND OF THE INVENTION

1. Field of the Invention

The present invention relates to a test apparatus configured to test a device under test, and particularly to a power supply circuit for the test apparatus.

2. Description of the Related Art

In a testing operation for a semiconductor integrated circuit (which will be referred to as the "DUT" hereafter) that employs CMOS (Complementary Metal Oxide Semiconductor) technology such as a CPU (Central Processing Unit), DSP (Digital Signal Processor), memory, or the like, electric current flows in a flip-flop or a latch included in the DUT while it operates receiving the supply of a clock. When the clock is stopped, the circuit enters a static state in which the amount of current decreases. Accordingly, the sum total of the operating current (load current) of the DUT changes over time depending on the content of the test operation, and so forth.

A power supply circuit configured to supply electric power to such a DUT has a configuration employing a regulator, for example. Ideally, such a power supply circuit is capable of supplying constant electric power regardless of the load current. However, in actuality, such a power supply circuit has an output impedance that is not negligible. Furthermore, between the power supply circuit and the DUT, there is an impedance component that is not negligible. Accordingly, the power supply voltage fluctuates due to fluctuation in the load.

Fluctuation in the power supply voltage seriously affects the test margin for the DUT. Furthermore, such fluctuation in the power supply voltage affects the operations of other circuit blocks included in the test apparatus, such as a pattern generator configured to generate a pattern to be supplied to the DUT, a timing generator configured to control the pattern transition timing, etc., leading to deterioration in the test accuracy.

With such a technique described in Patent document 2, a power supply apparatus includes a compensation circuit including a switch configured such that its switching on/off is controlled according to the output of a driver, in addition to a main power supply configured to supply power supply voltage to a device under test.

FIG. 1 is a block diagram showing a configuration of a power supply apparatus including a compensation circuit investigated by the present inventors. A DUT 1 is arranged such that a power supply voltage $V_{DD}$ is supplied to a power supply terminal P1 thereof, and a ground terminal P2 thereof is grounded. Furthermore, a test pattern $S_{TEST}$ is supplied to an I/O terminal P3 of the DUT 1 from a driver included in an unshown test apparatus.

A power supply apparatus 8 includes a main power supply 10 and a power supply compensation circuit 12, and is configured to supply the power supply voltage $V_{DD}$ to the power supply terminal P1 of the DUT 1. The output terminal of the main power supply 10 is connected to the power supply terminal P1 of the DUT 1 via a power supply line. The main power supply 10 is configured as a combination circuit composed of a digital circuit and a digital/analog converter, a linear regulator, a switching regulator, or the like. The main power supply 10 is configured to receive a feedback signal that corresponds to the power supply voltage $V_{DD}$ at the power supply terminal P1, and to feedback control the output voltage $V_{OUT}$ such that the power supply voltage $V_{DD}$ matches a target voltage $V_{REF}$.

A source current source 12b included in the power supply compensation circuit 12 is configured to perform a switching operation according to a control pattern $S_{CNT1}$, and to inject a pulse-shaped compensation current $I_{SRC}$ (functions as a source) into the power supply terminal P1 of the DUT 1 via a path that differs from that of the main power supply 10. A sink current source 12c is configured to perform a switching operation according to a control pattern $S_{CNT2}$, and to draw a pulse-shaped compensation current $I_{SINK}$ (functions as a sink) via a path that differs from that of the DUT 1.

With such an arrangement, the compensation control patterns $S_{CNT1}$ and $S_{CNT2}$ to be applied to the power supply compensation circuit 12 are defined such that they are associated with the test pattern $S_{TEST}$, so as to cancel out changes in the power supply voltage $V_{DD}$ that occur according to the supply of the test pattern $S_{TEST}$ to the DUT. In an actual test operation, by controlling the power supply compensation circuit 12 according to the control patterns $S_{CNT1}$ and $S_{CNT2}$ while supplying the test pattern $S_{TEST}$ to the DUT 1, such an arrangement allows the power supply voltage $V_{DD}$ to be maintained at a constant voltage.

RELATED ART DOCUMENTS

Patent Documents

[Patent Document 1]
Japanese Patent Application Laid Open No. 2007-205813
[Patent Document 2]
International Publication WO 10/029,709A1 pamphlet It is rare for an ideal power supply to be employed in an environment in which such a DUT is actually operated (which will be referred to as an "actual operation environment"). In actuality, typical circuits employ a power supply having a poor response speed or having a large output impedance from the viewpoint of costs or the circuit area. In such an actual operation environment, the power supply voltage cannot be maintained at a constant voltage, i.e., it dynamically fluctuates according to the operation state of the DUT.

Thus, there is a demand for a technique in which, in such a test of a DUT, intentional fluctuation is applied to the power supply voltage so as to provide the same power supply environment as that in the actual operation environment of the DUT. Such a technique will be referred as an "emulation of a power supply environment" in the present specification. The aforementioned compensation circuit is effectively employed for such an emulation of a power supply environment. That is to say, the control patterns are determined so as to provide a desired power supply voltage waveform, and the compensation current generated by the compensation circuit is changed over time according to the control patterns thus generated.

SUMMARY OF THE INVENTION

The present inventors have investigated such an emulation of a power supply environment, and has come to recognize the following problem.

FIGS. 2A and 2B are diagrams for describing such an emulation of a power supply environment. Let us consider a case in which the operating current $I_{OP}$ that flows into the power supply terminal of the DUT 1 rises at a time point t1 according to the test pattern.

FIG. 2A shows an emulation operation in a case of emulating an ideal power supply having no power supply voltage fluctuation. $V_{DD}$ represents the waveform of the power supply voltage $V_{DD}$ when the power supply compensation circuit 12 is not operated. When the operating current $I_{OP}$ increases at the time point t1, the power supply voltage $V_{DD}$ drops from the target value $V_{REF}$ due to the response delay of the main power supply 10. Subsequently, the power supply voltage $V_{DD}$ approaches the target value $V_{REF}$ with the passage of time. $V_{TGT}$ represents the waveform of the power supply voltage to be emulated. In a case of emulating an ideal power supply, $V_{TGT}$ matches a target value $V_{REF}$ which is a constant value.

The power supply compensation circuit 12 generates (i) a compensation current $I_{CMP}$ that matches the fluctuation of the operating current $I_{OP}$, or otherwise (ii) a compensation current $I_{CMP}$ that matches the fluctuation of the operating current $I_{OP}$ immediately after the time point t1, and which attenuates at a speed that is sufficiently slower than the response speed of the power supply voltage $V_{DD}$. Such a power supply compensation circuit 12 allows the response speed of the main power supply 10 to be compensated for, thereby maintaining the power supply voltage $V_{DD}$ at a constant voltage.

FIG. 2B shows an emulation operation in a case of emulating an actual operating environment. In this case, a power supply apparatus to be emulated has a non-negligible output DC resistance. In addition, the power supply to be emulated has a response speed that is slower than that of the main power supply 10, leading to a long voltage recovery time. Accordingly, the power supply voltage $V_{TGT}$ to be emulated drops according to an increase in the operating current $I_{OP}$. The main power supply 10 shown in FIG. 1 is designed such that it has a very small output DC current resistance. Thus, in order to emulate the power supply voltage waveform $V_{TGT}$ shown in FIG. 2B by means of the power supply apparatus 8, the power supply compensation circuit 12 must always generate a very large negative compensation current $I_{CMP}$ (i.e., a sink current $I_{SINK}$), leading to a problem of very large power consumption of the power supply apparatus 8.

The present invention has been made in order to solve such a problem. Accordingly, it is an exemplary purpose of an embodiment of the present invention to provide a power supply apparatus which is capable of emulating a desired power supply voltage waveform with small power consumption.

An embodiment of the present invention relates to a test apparatus configured to test a device under test. The test apparatus comprises: a test unit configured to supply a predetermined test pattern to the device under test; a main power supply arranged such that its output terminal is connected to a power supply terminal of the device under test via a power supply line, and is configured to feedback control an output voltage output via the output terminal such that a detection value that corresponds to a power supply voltage at the power supply terminal approaches a target value; and a power supply control unit configured to feedforward control the main power supply such that the power supply voltage approaches a predetermined target waveform when the test unit supplies the test pattern to the device under test.

With such an embodiment, by feedforward controlling the feedback-type main power supply according to the waveform of the operating current of the device under test determined according to the test pattern, such an arrangement is capable of emulating a desired power supply voltage waveform.

Furthermore, even if the level of the target waveform after transition differs from that before transition, such an arrangement does not require very large power consumption of the main power supply. Thus, such an arrangement provides reduced power consumption as compared with an arrangement in which intentional fluctuation is applied to the power supply voltage by means of the compensation circuit alone.

Also, the main power supply may comprise: an error signal generating unit configured to generate an error signal that corresponds to an error between the detection value and the target value; and a feedback output unit configured to feedback control the output voltage according to the error signal such that the error becomes zero. Also, the power supply control unit may be configured to superimpose on the target value a correction voltage that corresponds to the target waveform.

Such an embodiment allows the target value for the feedback control operation of the main power supply to be changed according to the target waveform, thereby controlling the power supply voltage such that it approaches the target waveform.

Also, the main power supply may comprise: an error signal generating unit configured to generate an error signal that corresponds to an error between the detection value and the target value; and a feedback output unit configured to feedback control the output voltage according to the error signal such that the error becomes zero. Also, the power supply control unit may be configured to superimpose on the detection value a correction voltage that corresponds to the target waveform.

Such an embodiment allows the target value for the feedback control operation of the main power supply to be changed according to the target waveform, thereby controlling the power supply voltage such that it approaches the target waveform.

Also, the power supply control unit may comprise: a first waveform acquisition unit configured to acquire a first waveform, which is a waveform of the power supply voltage supplied to the device under test in a state in which the target value set for the main power supply is fixed, when the device under test operates according to the test pattern; a target waveform acquisition unit configured to acquire the target waveform; and a correction voltage calculation unit configured to calculate the correction voltage based on the differential waveform between the first waveform and the target waveform.

The differential waveform represents the waveform of voltage fluctuation to be intentionally applied to the power supply voltage by means of the main power supply. Thus, by calculating the correction voltage according to the differential waveform, such an arrangement is capable of controlling the power supply voltage such that it approaches the target waveform.

Also, the correction voltage calculation unit may be configured to generate the correction voltage by multiplying the differential waveform by a predetermined coefficient K. Also, the coefficient K may be represented by $V_{REF}/V_{DD}$, with $V_{REF}$ as the target value when the correction voltage is zero, and with $V_{DD}$ as the power supply voltage.

Also, the correction voltage calculation unit may be configured to generate the correction voltage by multiplying the differential waveform by an inverse function of a transfer function of the main power supply.

Also, the correction voltage calculation unit may be configured to boost a high-frequency component of the differential waveform.

The high-frequency component range of the transfer function of the main power supply has a low gain. Thus, by boosting the high-frequency component beforehand, such an arrangement is capable of controlling the power supply voltage such that it approaches the target waveform.

Also, a test apparatus according to an embodiment may further comprise a compensation circuit configured such that, when the device under test executes a given operation sequence in response to the test pattern, the aforementioned compensation circuit (i) injects a compensation current that corresponds to the operation sequence into the power supply terminal via a path that differs from that of the main power supply, and additionally or alternatively (ii) draws, via a path that differs from that of the device under test, the compensation current from the power supply current that flows from the main power supply to the device under test.

Also, the power supply control unit may further comprise: a second waveform acquisition unit configured to acquire a second waveform, which is a waveform of the power supply voltage supplied to the device under test in a state in which the main power supply is feedforward controlled by the power supply control unit, when the device under test operates in response to the test pattern; and a compensation current calculation unit configured to calculate the compensation current to be generated by the compensation circuit, based on the differential waveform between the second waveform and the target waveform.

In some cases, an arrangement including the main power supply alone cannot control the power supply voltage such that it perfectly matches the target waveform. In this case, by providing such a compensation circuit having a responsiveness that is higher than that of the main power supply, such an arrangement is capable of controlling the power supply voltage such that it approaches closer to the target waveform.

Also, the main power supply may comprise: an error signal generating unit configured to generate an error signal that corresponds to the error between the detection value and the target value; and a feedback output unit configured to feedback control the output voltage according to the error signal such that the error becomes zero. Also, at least one from among a transfer function of the error signal generating unit and a transfer function of the feedback output unit is configured to be adjustable. Also, the power supply control unit may be configured to control the transfer function of the error signal generating unit and the transfer function of the feedback output unit according to the target waveform.

Also, the main power supply may be configured as a switching regulator. Also, the power supply control unit may be configured to control at least one from among a switching frequency of the switching regulator, a transistor size (i.e., on resistance) of a switching transistor, an amplitude of a driving signal (gate voltage or otherwise base current) to be supplied to the switching transistor, and an inductance of an inductor.

Also, the main power supply may be configured as a digital control power supply. Also, the error signal generating unit may comprise a subtractor configured to generate deviation between the detection value and the target value. Also, the feedback output unit may comprise a digital calculation unit configured to perform any one from among P (Proportional) control, PI (Proportional Integral) control, and PID (Proportional Integral Derivative) control. Also, the power supply control unit may be configured to control a control parameter of the digital calculation unit.

Also, the main power supply may be configured as an analog control power supply. Also, the error signal generating unit may comprise: an error amplifier configured to amplify an error between the detection value and the target value; and a phase compensation circuit provided to the error amplifier. Also, the power supply control unit may be configured to control at least one from among a bias current of the error amplifier and a time constant of the phase compensation circuit.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, a state represented by the phrase "the member A is connected to the member B" includes a state in which the member A is indirectly connected to the member B via another member that does not affect the electric connection therebetween, in addition to a state in which the member A is physically and directly connected to the member B. Similarly, a state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 3:
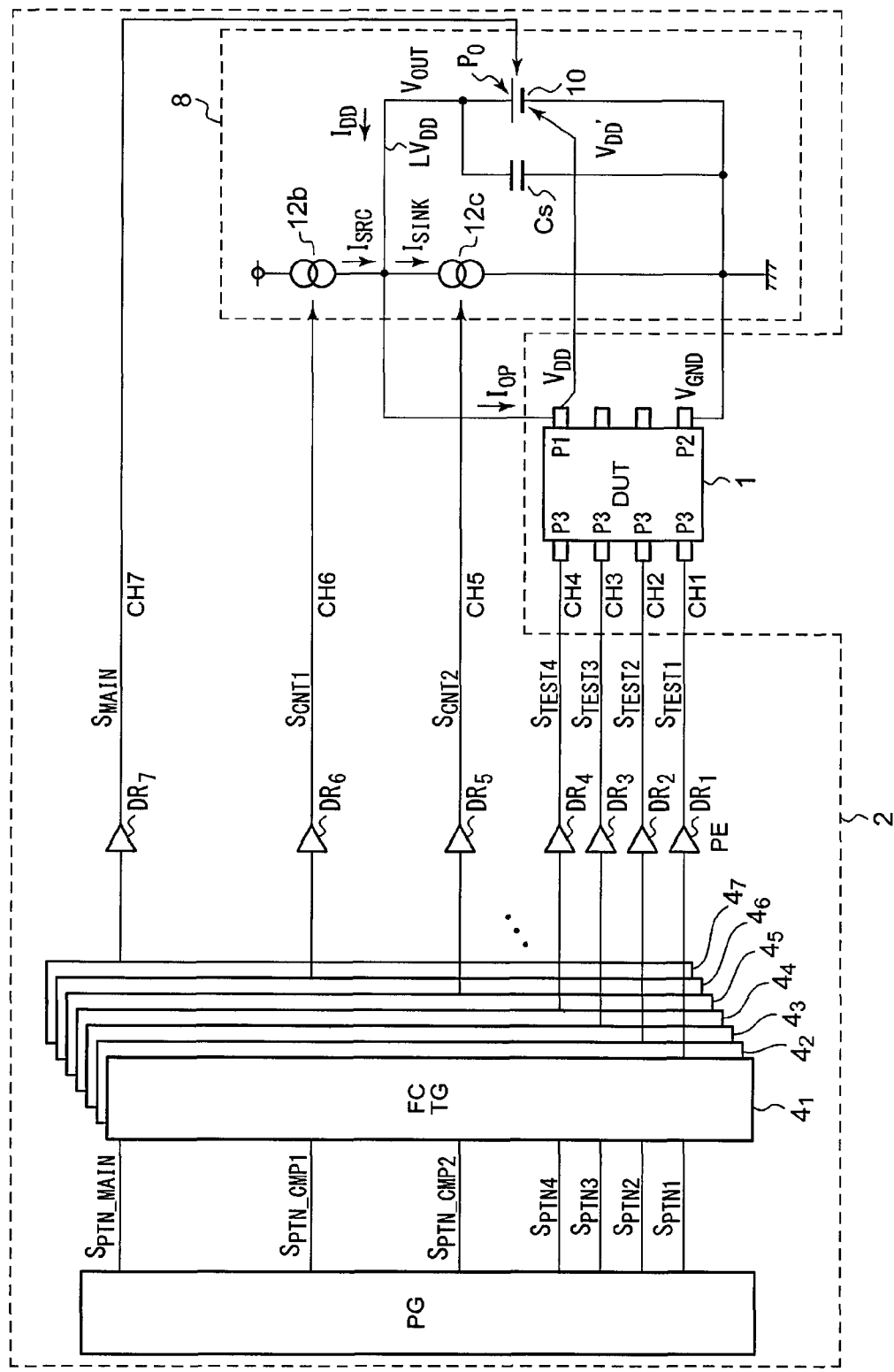
FIG. 3 is a block diagram showing a configuration of a test apparatus according to an embodiment.

FIG. 3 is a block diagram which shows a configuration of a test apparatus according to an embodiment. FIG. 3 shows a semiconductor device (which will be referred to as "DUT" hereafter) 1 to be tested, in addition to the test apparatus 2.

The DUT 1 includes multiple pins. At least one of the multiple pins is a power supply terminal P1 configured to receive a power supply voltage $V_{DD}$, and at least one other pin is configured as a ground terminal P2. The multiple input/output (I/O) pins P3 are each configured to receive data from outside the circuit or to output data to outside the circuit. In the test operation, the multiple input/output terminals P3 receive a test signal (test pattern) $S_{TEST}$ output from the test apparatus 2, or output data that corresponds to the test signal $S_{TEST}$ to the test apparatus 2. FIG. 3 shows only a part of the configuration of the test apparatus 2, which is configured to supply a test signal to the DUT 1. That is to say, another configuration thereof configured to evaluate a signal received from the DUT 1 is not shown.

The test apparatus 2 includes a power supply apparatus 8, a pattern generator PG, multiple timing generators TG, multiple waveform shapers FC, and multiple drivers DR.

The test apparatus 2 includes multiple channels, i.e., n channels CH1 through CHn, several channels (CH1 through CH4) of which are respectively assigned to the multiple I/O terminals P3 of the DUT 1. FIG. 3 shows an arrangement in which n=7. However, in practical use, the number of channels of the test apparatus 2 is on the order of several hundred to several thousand. With the test apparatus 2, the first through the fourth channels CH1 through CH4 each function as a test unit configured to supply a test pattern to the DUT 1.

The power supply apparatus 8 is configured to generate the power supply voltage $V_{DD}$ to be supplied to the power supply terminal P1 of the DUT 1. The power supply apparatus 8 includes a main power supply 10 and a power supply compensation circuit 12.

The main power supply 10 is configured as a linear regulator, a switching regulator, a combination circuit composed of a digital circuit and a digital/analog converter, or the like. Specifically, the output terminal Po of the main power supply 10 is connected to the power supply terminal P1 of the DUT 1 via a power supply line $L_{VDD}$.

Typically, the impedance of the power supply line $V_{DD}$ is not zero. Thus, the output voltage $V_{OUT}$ of the main power supply 10 is not the same as the power supply voltage $V_{DD}$ at the power supply terminal P1. The detection value $V_{DD}'$ that corresponds to the power supply voltage $V_{DD}$ at the power supply terminal P1 is fed back to the main power supply 10. The main power supply 10 is configured to feedback control the output voltage $V_{OUT}$ output via the output terminal Po such that the detection value $V_{DD}'$ that corresponds to the power supply voltage $V_{DD}$ approaches the target value $V_{REF}$. It should be noted that, in a case in which there is no need to reduce the effects of the impedance of the power supply line $L_{VDD}$, the detection value $V_{DD}'$ may be obtained based on the output voltage $V_{OUT}$ that develops in the vicinity of the output terminal of the main power supply 10.

The capacitor Cs is provided in order to smooth the power supply voltage $V_{DD}$. The main power supply 10 is configured to generate a power supply voltage to be supplied to the DUT 1. In addition, the main power supply 10 is further configured to generate a power supply voltage to be supplied to the other circuit blocks included in the test apparatus 2. The output current flowing from the main power supply 10 to the power supply terminal P1 of the DUT 1 will be referred to as the "power supply current $I_{DD}$".

The main power supply 10 is configured as a voltage/current source having a limited response speed. Accordingly, in some cases, the main power supply 10 cannot follow a sudden change in the load current, i.e., the operating current $I_{OP}$ of the DUT 1. For example, when the operating current $I_{OP}$ changes in a stepwise manner, overshoot or undershoot occurs in the power supply voltage $V_{DD}$, following which, in some cases, ringing occurs in the power supply voltage $V_{DD}$. Such fluctuation in the power supply voltage $V_{DD}$ leads to difficulty in testing the DUT 1 with high precision. This is why, when an error is detected in the operation of the DUT 1, such an arrangement cannot judge whether such an error is due a manufacturing fault in the DUT 1 or due to the fluctuation in the power supply voltage $V_{DD}$.

The power supply compensation circuit 12 is provided in order to compensate for the response speed of the main power supply 10. The designer of the DUT 1 can estimate the change in the operating rate of an internal circuit of the DUT 1 and the like over time when a known test signal $S_{TEST}$ (test pattern $S_{PTN}$) is supplied to the DUT 1. Accordingly, the designer can predict the waveform of the operating current $I_{OP}$ of the DUT 1 over time with high precision. Examples of such a prediction method include a calculation method using computer simulation, or an actual measurement method in which a device having the same configuration as that of the DUT 1 is measured. Such a prediction method is not restricted in particular.

Furthermore, in a case in which the response speed of the main power supply 10 (gain, feedback band) is known, the designer can also estimate the power supply current $I_{DD}$, the output voltage $V_{OUT}$, and the power supply voltage $V_{DD}$, generated by the main power supply 10 according to the estimated operating current $I_{OP}$. In this case, by compensating for the difference between the estimated operating current $I_{OP}$ and the estimated power supply current $I_{DD}$ by means of the power supply compensation circuit 12, such an arrangement is capable of stabilizing the power supply voltage $V_{DD}$.

It should be noted that there is a differential relation or otherwise an integral relation between the power supply voltage $V_{DD}'$ and the power supply current $I_{DD}$. Specifically, whether the relation between the voltage and the current is a differential relation or an integral relation is determined depending upon which component is dominant from among the capacitance, the inductance, and the resistance, with respect to the output impedance of the main power supply 10 and the impedance of a path from the main power supply 10 up to the power supply terminal P1.

The power supply compensation circuit 12 includes a source current source 12b and a sink current source 12c. The source current source 12b and the sink current source 12c each include a switch using a MOSFET (Metal Oxide Semiconductor Field Effect Transistor), for example, and are respectively controlled according to the respective control signals $S_{CNT1}$ and $S_{CNT2}$.

When the source current source 12b is turned on according to the control signal $S_{CNT1}$, a compensation pulse current (which will also be referred to as the "source pulse current") $I_{SRC}$ is generated. The power supply compensation circuit 12 injects the source pulse current $I_{SRC}$ into the power supply terminal P1 via a path that differs from that of the main power supply 10. The sink current source 12c is arranged between another fixed voltage terminal (e.g., the ground terminal) and the power supply terminal P1 of the DUT 1. When the sink current source 12c is turned on according to the control signal $S_{CNT2}$, a compensation pulse current $I_{SINK}$ (which will also be referred to as the "sink pulse current") is generated. The power supply compensation circuit 12 draws, via a path that differs from that to the DUT 1, the sink pulse current $I_{SINK}$ from the power supply current $I_{DD}$ that flows to the power supply terminal P1.

The relation between the operating current $I_{op}$ that flows into the power supply terminal P1 of the DUT 1, the power supply current $I_{DD}$ output from the main power supply 10, and the compensation current $I_{CMP}$ output from the power supply compensation circuit 12, is represented by the following Expressions (1) and (2) based on the law of conservation of current.

$$I_{OP} = I_{DD} + I_{CMP} \quad (1)$$

$$I_{CMP} = I_{SRC} - I_{SINK} \quad (2)$$

That is to say, the source current source 12b supplies the positive component of the compensation current $I_{CMP}$ as a source pulse current $I_{SRC}$. Furthermore, the sink current source 12c supplies the negative component of the compensation current $I_{CMP}$ as a sink pulse current $I_{SINK}$.

Among the drivers $DR_1$ through $DR_6$, the driver $DR_6$ is assigned to the source current source 12b, and the driver $DR_5$ is assigned to the sink current source 12c. Of the other drivers, i.e., the drivers $DR_1$ through $DR_4$, at least one is respectively assigned to at least one of the I/O terminals P3 of the DUT 1.

A pair comprising the waveform shaper FC and the timing generator TG is collectively referred to as an "interface circuit 4". Multiple interface circuits $4_1$ through $4_6$ are respectively provided for the channels CH1 through CH6, i.e., for the drivers $DR_1$ through $DR_6$. The i-th ($1 \le i \le 6$) interface circuit $4_i$ shapes the input pattern signal $S_{PTNi}$ such that it has a signal format that is suitable for the driver DR, and outputs the pattern signal thus shaped to the corresponding driver $DR_i$.

The pattern generator PG generates the pattern signals $S_{PTN}$ for the interface circuits $4_1$ through $4_6$ according to a test program. Specifically, with regard to the drivers $DR_1$ through $DR_4$ respectively assigned to the I/O terminals P3 of the DUT 1, the pattern generator PG outputs the test patterns $S_{PTNi}$, each specifying a test signal $S_{TESTi}$ to be generated by the corresponding driver $DR_i$, to the respective interface circuits $4_i$ that correspond to the respective drivers $DR_i$. Each test pattern $S_{PTNi}$ includes data which represents the signal level of the test signal $S_{TESTi}$ for each cycle (unit interval), and data which indicates the timing at which the signal level transits.

Furthermore, the pattern generator PG generates the compensation control pattern $S_{PTN\_CMP}$ determined according to the required compensation current $I_{CMP}$. The control pattern $S_{PTN\_CMP}$ includes a control pattern $S_{PTN\_CMP1}$ that specifies the control signal $S_{CNT1}$ which is to be generated by the driver $DR_6$ assigned to the source current source 12b, and a control pattern $S_{PTN\_CMP2}$ that specifies the control signal $S_{CNT2}$ which is to be generated by the driver $DR_5$ assigned to the sink current source 12c. The control pattern $S_{PTN\_CMP1}$ includes data which specifies the on/off state of the source current source 12b and its on/off switching timing, and the control pattern $S_{PTN\_CMP2}$ includes data which specifies the on/off state of the sink current source 12c and its on/off switching timing.

The pattern generator PG generates the control patterns $S_{PTN\_CMP1}$ and $S_{PTN\_CMP2}$ which provide compensation for fluctuation in the operating current of the DUT 1 based on the test patterns $S_{PTN1}$ through $S_{PTN4}$, i.e., according to the fluctuation in the operating current of the DUT 1. Subsequently, the pattern generator PG outputs the control patterns $S_{PTN\_CMP1}$ and $S_{PTN\_CMP2}$ thus generated to the respective interface circuits $4_6$ and $4_5$.

As described above, if the test patterns $S_{PTN1}$ through $S_{PTN4}$ are known, the waveform over time of the operating current $I_{OP}$ of the DUT 1 can be estimated. Thus, the compensation current $I_{CMP}$ to generated in order to maintain the power supply voltage $V_{DD}$ at a constant voltage, i.e., the waveforms over time of the compensation currents $I_{SRC}$ and $I_{SINK}$ can be calculated.

When the estimated operating current $I_{OP}$ is greater than the power supply current $I_{DD}$, the power supply compensation circuit 12 generates a source compensation current $I_{SRC}$ so as to compensate for a shortfall in the current. The required current waveform of such a source compensation current $I_{SRC}$ can be predicted. Thus, the source current source 12b is controlled so as to appropriately generate such a source compensation current $I_{SRC}$. For example, the source current source 12b may be controlled by pulse width modulation. Alternatively, pulse amplitude modulation, delta-sigma modulation, pulse density modulation, pulse frequency modulation, or the like, may be employed.

With such a test apparatus 2, the fifth channel CH5 and the sixth channel CH6 correspond to a power supply control unit configured to control the power supply compensation circuit 12.

Figure 4:
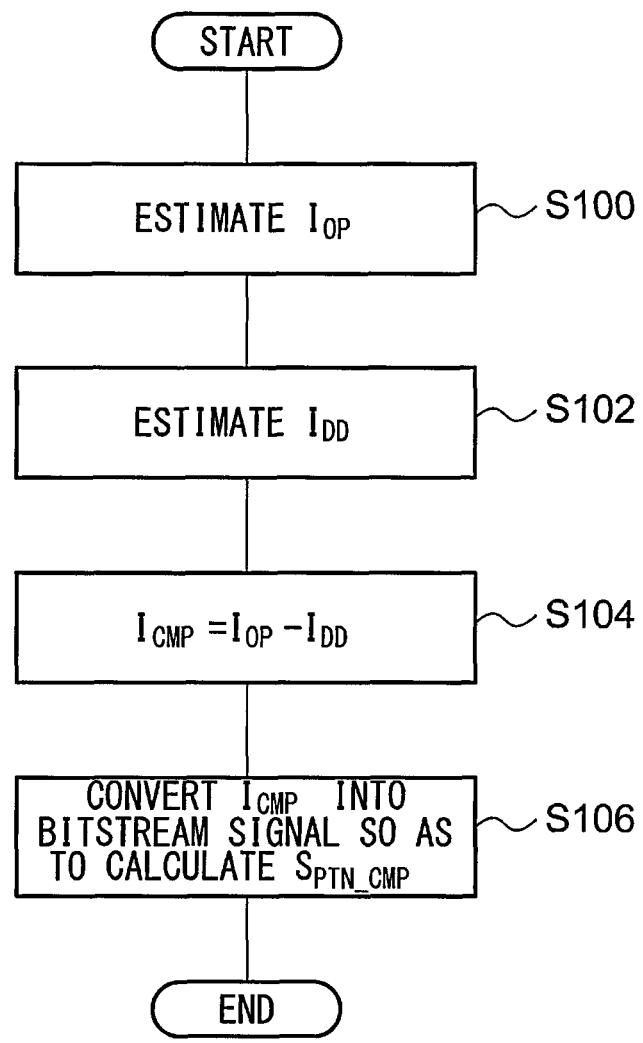
FIG. 4 is a flowchart showing an example of a method for calculating a control pattern.

FIG. 4 is a flowchart showing an example of a method for calculating the control pattern. The operating current $I_{OP}$ of the DUT 1 is estimated based on the test pattern input to the DUT 1 and/or the circuit information (S100). Furthermore, such an arrangement calculates the power supply current $I_{DD}$ output from the main power supply 10 for when a given event occurs in a state in which the DUT 1 is connected as a load to the main power supply 10 (S102). In a case in which an ideal power supply is to be provided, the compensation current $I_{CMP}$ to be generated by the power supply compensation circuit 12 is set to the difference between the estimated operating current $I_{OP}$ and the power supply current $I_{DD}$ (S104).

Subsequently, the waveform of the compensation current $I_{CMP}$ to be generated is subjected to delta-sigma modulation, PWM (pulse width modulation), PDM (pulse density modulation), PAM (pulse amplitude modulation), PFM (pulse frequency modulation), or the like, so as to generate a bitstream control pattern $S_{PTN\_CMP}$ (S106). For example, an arrangement may be made in which the compensation current $I_{CMP}$ is sampled for each test cycle, and the compensation circuit $I_{CMP}$ thus sampled is subjected to pulse modulation.

Figure 5:
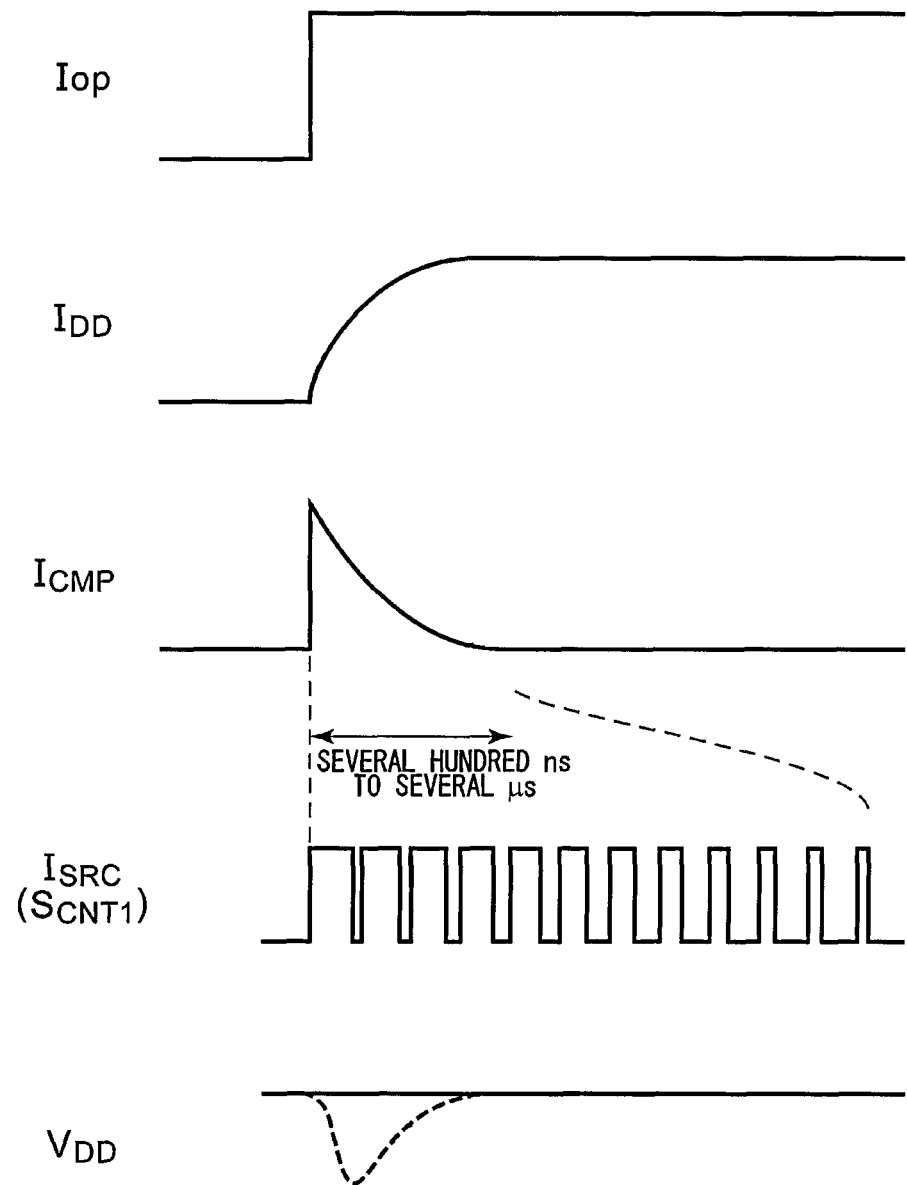
FIG. 5 is a waveform diagram showing an example of an operating current $I_{OP}$, a power supply current $I_{DD}$, a compensation current $I_{CMP}$, and a source pulse current $I_{SRC}$.

FIG. 5 is a waveform diagram which shows an example of the operating current $I_{OP}$, the power supply current $I_{DD}$, the compensation current $I_{CMP}$, and the source pulse current $I_{SRC}$. Let us say that, when a certain test signal $S_{TEST}$ is supplied to the DUT 1, the operating current $I_{OP}$ of the DUT 1 rises in a stepwise manner. In response to the increase in the operating current $I_{OP}$, the power supply current $I_{DD}$ is supplied from the main power supply 10. However, such a power supply current $I_{DD}$ does not have an ideal step waveform because of the limited response speed. This leads to a shortfall in the current to be supplied to the DUT 1. As a result, if the compensation current $I_{SRC}$ is not supplied, the power supply voltage $V_{DD}$ falls as indicated by the broken line.

The power supply compensation circuit 12 generates the source compensation current $I_{CMP}$ that corresponds to the difference between the operating current $I_{OP}$ and the power supply current $I_{DD}$. The source compensation current $I_{CMP}$ is generated as the source pulse current $I_{SRC}$ generated according to the control signal $S_{CNT1}$. The source compensation current $I_{CMP}$ is required to be at its maximum value immediately after the change in the operating current $I_{OP}$, and is required to gradually fall from its maximum value. Accordingly, the on time (duty ratio) of the source current source 12b is reduced over time using PWM (pulse width modulation), for example, thereby generating the required source compensation current $I_{CMP}$.

In a case in which all the channels of the test apparatus 2 operate in synchronization with a test rate, the period of the control signal $S_{CNT1}$ matches the period (unit interval) of data to be supplied to the DUT 1, or a period obtained by multiplying or dividing the period of the data by an integer. For example, in a case in which the period of the control signal $S_{CNT1}$ is set to 4 ns in a system in which the unit interval is 4 ns, the on period $T_{ON}$ of each pulse included in the control signal $S_{CNT1}$ can be adjusted in a range between 0 and 4 ns. The response speed of the main power supply 10 is on the order of several hundred ns to several μs. Thus, the waveform of the compensation current $I_{CMP}$ can be controlled by adjusting several hundred of the pulses included in the control signal $S_{CNT1}$. A method for deriving the control signal $S_{CNT1}$ required to generate the source compensation current $I_{CMP}$ based upon the waveform thereof will be described later.

Conversely, when the operating current $I_{OP}$ is smaller than the power supply current $I_{DD}$, the power supply compensation circuit 12 generates a sink pulse current $I_{SINK}$ so as to provide the sink compensation current $I_{CMP}$, thereby drawing the excess current.

By providing such a power supply compensation circuit 12, such an arrangement is capable of compensating for a shortfall in the response speed of the main power supply 10, thereby maintaining the power supply voltage $V_{DD}$ at a constant level as indicated by the solid line in FIG. 4. It should be noted that the configuration of the power supply compensation circuit 12 is not restricted in particular. Rather, various kinds of current sources and various kinds of voltage sources may be employed as the power supply compensation circuit 12.

Description has been made regarding an arrangement in which the power supply apparatus 8 is operated as an ideal power supply which is capable of maintaining its power supply voltage $V_{DD}$ at a constant level regardless of the operating state of the DUT 1. Description will be made below regarding a technique for emulating a desired power supply voltage waveform by intentionally applying fluctuation to the power supply voltage $V_{DD}$ by means of the power supply apparatus 8.

Returning to FIG. 3, with the test apparatus 2, the seventh channel CH7 corresponds to a main power supply control unit configured to control the main power supply 10.

When the test unit (CH1 through CH4) supplies the test pattern $S_{TEST}$ to the DUT 1, the main power supply control unit (CH7) feedforward controls the main power supply 10 such that the power supply voltage $V_{DD}$ approaches a predetermined target waveform $V_{TGT}(t)$.

Description will be made regarding a specific example of the feedforward control operation.

Figure 6A:
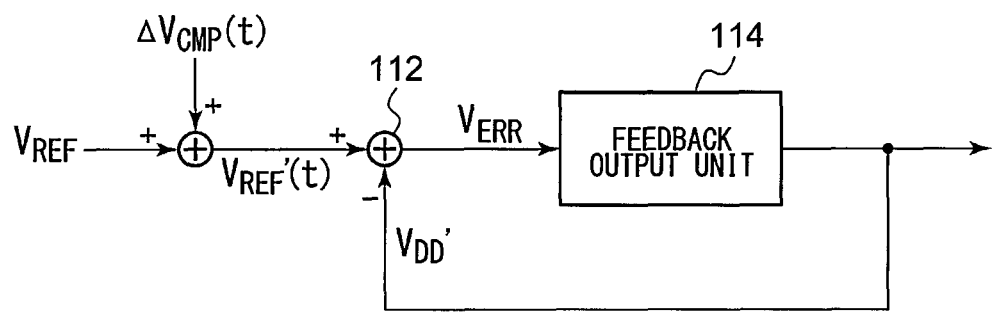
FIGS. 6A and 6B are block diagrams each showing an example configuration of a main power supply.
Figure 6B:
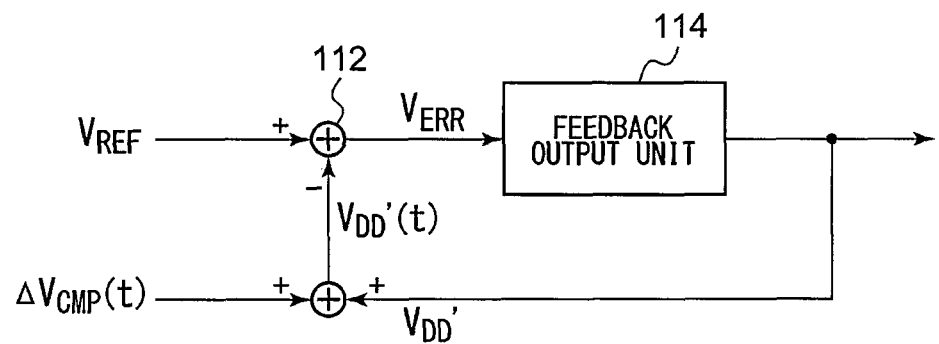

FIGS. 6A and 6B are block diagrams each showing an example configuration of the main power supply 10. As shown in FIGS. 6A and 6B, a typical feedback control power supply configured to perform an analog control operation or otherwise a digital control operation includes an error signal generating unit 112 configured to generate an error signal $V_{ERR}$ that corresponds to the error (deviation) between the detection value $V_{DD}'$ of the power supply voltage $V_{DD}$ and the target value $V_{REF}'$, and a feedback output unit 114 configured to feedback control the output voltage $V_{OUT}$ according to the error signal $V_{ERR}$ such that the error between them becomes zero.

The correction voltage $\Delta V_{CMP}(t)$ is fed forward to the main power supply 10 from an unshown main power supply control unit. With such a configuration shown in FIG. 6A, the main power supply control unit is configured to superimpose the correction voltage $\Delta V_{CMP}(t)$ that corresponds to the target waveform $V_{TGT}(t)$ on the target value $V_{REF}'$. On the other hand, with such a configuration shown in FIG. 6B, the main power supply control unit is configured to superimpose the correction $\Delta V_{CMP}(t)$ that corresponds to the target waveform $V_{TGT}(t)$ on the detection value $V_{DD}'(t)$.

Figure 7:
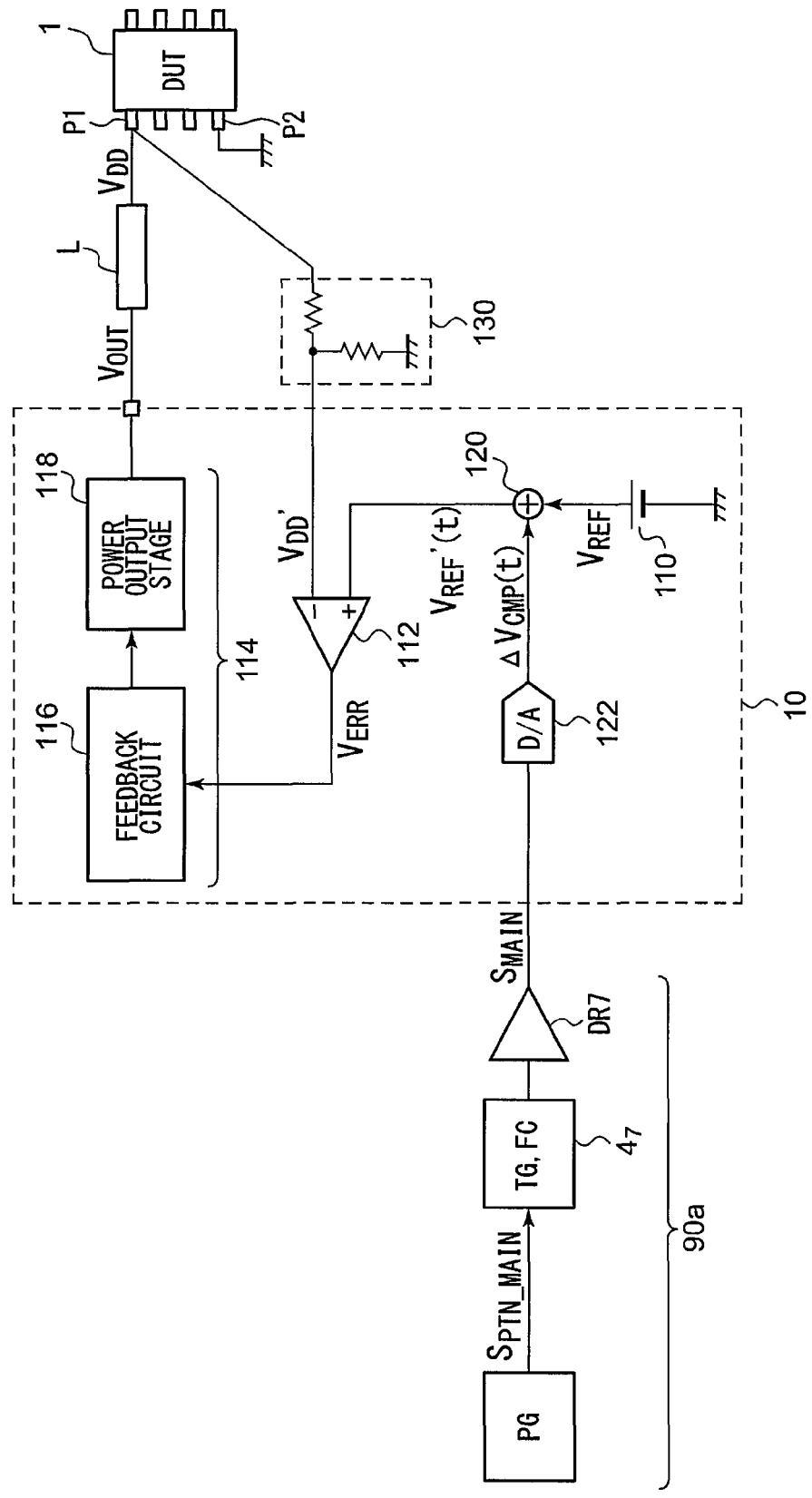
FIG. 7 is a block diagram showing a specific example configuration of the main power supply shown in FIG. 6A.

FIG. 7 is a block diagram showing a specific example configuration of the main power supply 10 shown in FIG. 6A. The main power supply 10 shown in FIG. 7 is configured as an analog control power supply, and mainly includes a reference voltage source 110, an error amplifier 112, and a feedback output unit 114. The reference voltage source 110 includes a bandgap reference circuit, for example, and is configured to generate a reference voltage $V_{REF}$ which does not depend on either the temperature or the power supply voltage. The error signal generating unit 112 is configured as a so-called error amplifier which amplifies the error (deviation) between the detection value $V_{DD}'$ and the target value $V_{REF}'$ so as to generate an error signal $V_{ERR}$. For example, a voltage dividing circuit 130, which divides the power supply voltage $V_{DD}$ by a predetermined voltage division ratio K, is provided on a feedback path of the power supply voltage $V_{DD}$, thereby generating the detection value $V_{DD}'$.

The feedback output unit 114 is configured to feedback control the output voltage $V_{OUT}$ such that the error between the two voltages $V_{REF}'$ and $V_{DD}'$ becomes zero. The feedback output unit 114 includes a feedback circuit 116 and a power output stage 118. The feedback circuit 116 is configured to generate an instruction value having a level adjusted according to the error signal $V_{ERR}$ such that the error between the detection value $V_{DD}'$ and the target value $V_{REF}'$ becomes zero. The power output stage 118 is configured to generate an output voltage $V_{OUT}$ according to the instruction value.

A main power supply control unit 90a is configured to superimpose the correction voltage $\Delta V_{CMP}(t)$ that corresponds to the target waveform $V_{TGT}(t)$ on the target value $V_{REF}'$. In order to provide such a function, the main power supply 10 shown in FIG. 7 includes an adder 120 and a digital/analog converter 122. The digital/analog converter 122 is configured to receive, from the main power supply control unit 90a, the data (which will be referred to as the "main power supply control pattern") $S_{MAIN}$ which represents the correction voltage $\Delta V_{CMP}(t)$, and to convert the data $S_{MAIN}$ thus received into an analog voltage $\Delta V_{CMP}$.

The adder 120 is configured to generate the sum of the reference voltage $V_{REF}$ and the correction voltage $\Delta V_{CMP}$, thereby superimposing the correction voltage $\Delta V_{CMP}(t)$ on the target value $V_{REF}'$. As described later, by appropriately determining the correction voltage $\Delta V_{CMP}(t)$ according to the target waveform $V_{TGT}(t)$, the target voltage $V_{REF}'$ is feedforward controlled, thereby allowing the power supply voltage $V_{DD}$ to be controlled such that it approaches the target waveform $V_{TGT}$.

Figure 8:
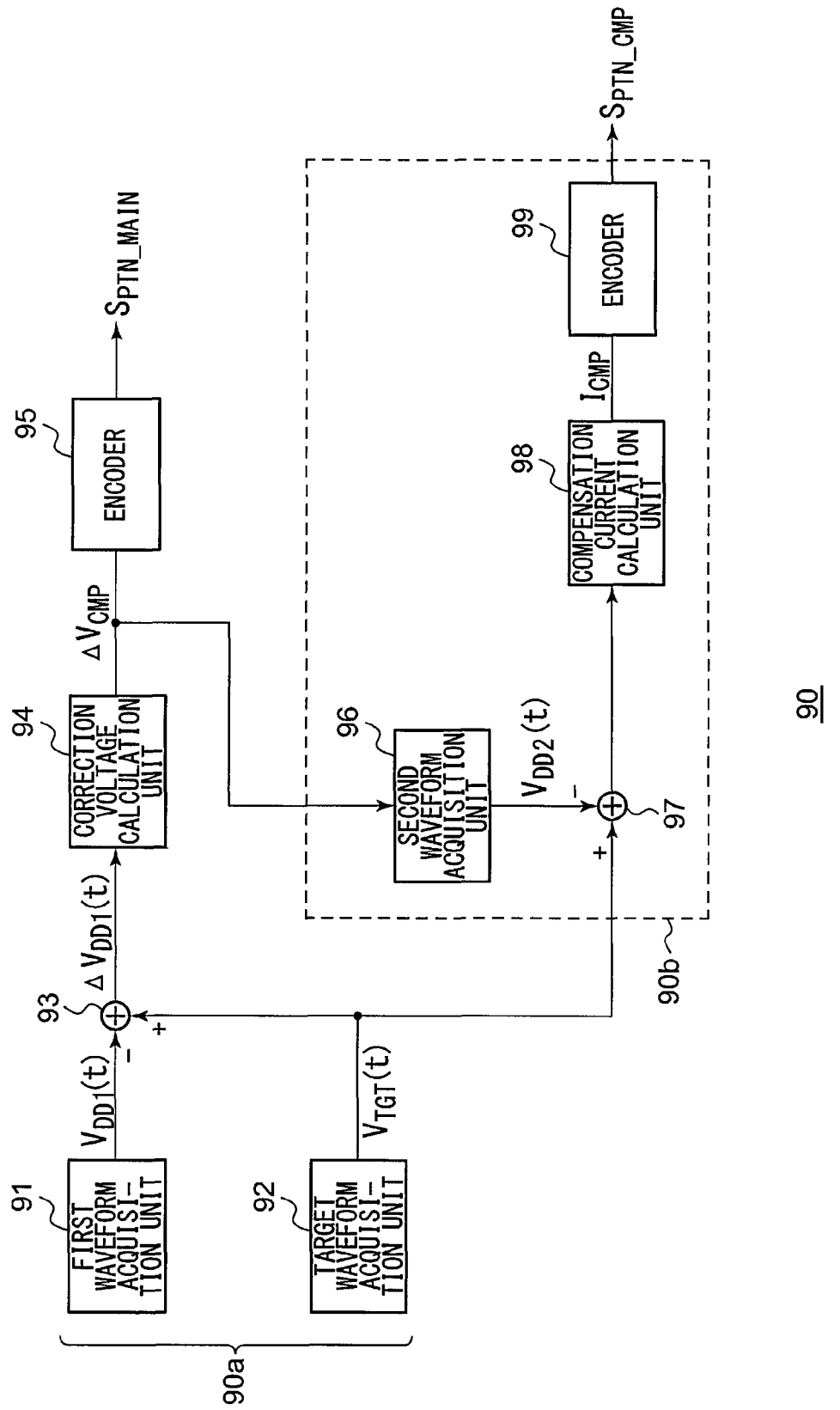
FIG. 8 is a block diagram showing an example configuration of a power supply control unit.

FIG. 8 is a block diagram showing an example configuration of a power supply control unit 90. The power supply control unit 90 includes the main power supply control unit 90a configured to control the main power supply 10, and a compensation circuit control unit 90b configured to control the power supply compensation circuit 12.

As described above, the main power supply control unit 90a includes the pattern generator PG, the interface circuit $4_7$, and the driver DR 7. FIG. 8 shows a part that corresponds to the pattern generator PG of the power supply control unit 90.

The power supply control unit 90 includes a first waveform acquisition unit 91, a target waveform acquisition unit 92, a subtractor 93, a correction voltage calculation unit 94, an encoder 95, a second waveform acquisition unit 96, a subtractor 97, a compensation current calculation unit 98, and an encoder 99. First, description will be made regarding the generation of the control pattern $S_{PTN\_MAIN}$.

The control pattern $S_{PTN\_MAIN}$ is generated by the main power supply control unit 90a, which includes the first waveform acquisition unit 91, the target waveform acquisition unit 92, the subtractor 93, the correction voltage calculation unit 94, and the encoder 95.

The test pattern $S_{TEST}$, which is an instruction supplied to the DUT 1 from the pattern generator PG, is known. Thus, the waveform over time of the operating current $I_{OP}$ of the DUT 1 can be estimated. Furthermore, if the characteristics of the error amplifier 112, the feedback circuit 116, and the power output stage 118, which are included in the main power supply 10, are known, the waveform of the power supply voltage $V_{DD}$ that corresponds to the operating current waveform $I_{OP}$ (which will also be referred to as the "first waveform $V_{DD1}$(t)") can also be estimated. The first waveform $V_{DD1}$(t) represents a power supply voltage waveform in a case in which the power supply control unit 90 does not feedforward control the main power supply 10 (i.e., the target value is fixed), and the power supply compensation circuit 12 does not perform a compensation operation. The first waveform acquisition unit 91 is configured to calculate the first waveform $V_{DD1}$(t), or otherwise to acquire the first waveform $V_{DD1}$(t) by actual measurement.

The target waveform acquisition unit 92 is configured to acquire the target waveform $V_{TGT}$(t). The target waveform $V_{TGT}$(t) is prepared beforehand by the user.

The subtractor 93 is configured to generate the differential waveform $\Delta V_{DD1}$(t), which is the difference between the first waveform $V_{DD1}$(t) and the target waveform $V_{TGT}$(t). The correction voltage calculation unit 94 is configured to calculate the correction voltage $\Delta V_{CMP}$(t) based on the differential waveform $V_{DD1}$(t).

For example, the correction voltage calculation unit 94 is configured to multiply the differential waveform $\Delta V_{DD1}$(t) by a predetermined coefficient K, so as to generate the correction voltage $\Delta V_{CMP}$(t). The coefficient K is represented by the ratio $V_{REF}/V_{DD}$ with $V_{REF}$ as the target value in a static state in which the correction voltage $\Delta V_{CMP}$ is zero and with $V_{DD}$ as the power supply voltage $V_{DD}$. Referring to the circuit diagram shown in FIG. 7, the coefficient K corresponds to the division ratio K of the voltage dividing circuit 130.

A modification may be made in which the correction voltage calculation unit 94 multiplies the differential waveform $\Delta V_{DD1}$(t) by the inverse function of the transfer function H(s) of the main power supply 10, which is represented by $V_{OUT}/V_{REF}$, so as to calculate the correction voltage $\Delta V_{CMP}$(t). In a case in which the differential waveform $\Delta V_{DD1}$(t) is multiplied by the coefficient K, such an arrangement provides a correction voltage that is not influenced by the frequency characteristics. In contrast, in a case in which the differential waveform $\Delta V_{DD1}$(t) is multiplied by the inverse function of the transfer function H(s), such an arrangement provides a correction voltage that is also influenced by the frequency characteristics.

Also, before the correction voltage calculation unit 94 calculates the correction voltage $\Delta V_{CMP}$(t), the high-frequency component of the differential waveform $\Delta V_{DD1}$(t) may be boosted. In a typical transfer function of the main power supply 10, the high-frequency component has a low gain. Thus, by boosting the high-frequency component of the differential waveform $\Delta V_{DD1}$(t) beforehand, such an arrangement is capable of controlling the power supply voltage $V_{DD}$ such that it approaches the target waveform $V_{TGT}$(t).

The encoder 95 is configured to encode the correction voltage $\Delta V_{CMP}$(t) in a predetermined format, so as to generate the control pattern $S_{PTN\_MAIN}$ for the main power supply 10. The format may be determined according to the configuration of the interface circuit 4 and the main power supply 10, and is not restricted in particular.

Next, description will be made regarding the control pattern $S_{PTN\_CMP}$ to be supplied to the power supply compensation circuit 12. The control pattern $S_{PTN\_CMP}$ is generated by the compensation circuit control unit 90b including the second waveform acquisition unit 96, the subtractor 97, the compensation current calculation unit 98, and the encoder 99.

When the DUT 1 operates according to the test pattern $S_{TEST}$, the second waveform acquisition unit 96 is configured to acquire the waveform of the power supply voltage in a state in which the main power supply 10 is feedforward controlled using the correction voltage $\Delta V_{CMP}$(t), and the operation of the power supply compensation circuit 12 is stopped (which will be referred to as the "second waveform $V_{DD2}$(t)"). The second waveform $V_{DD2}$(t) can be calculated, or otherwise can be acquired by actual measurement.

The subtractor 97 is configured to generate the differential voltage $\Delta V_{DD2}$(t), which is the difference between the second waveform $V_{DD2}$(t) and the target waveform $V_{TGT}$. The compensation current calculation unit 98 is configured to calculate the compensation current $I_{CMP}$ to be generated by the power supply compensation circuit 12, based on the differential voltage $\Delta V_{DD2}$(t). The encoder 99 is configured to apply pulse modulation or the like to the compensation current $I_{CMP}$ so as to generate the control pattern $S_{PTN\_CMP}$.

The above is the configuration of the test apparatus 2. Next, description will be made regarding the operation of the test apparatus 2.

Figure 9:
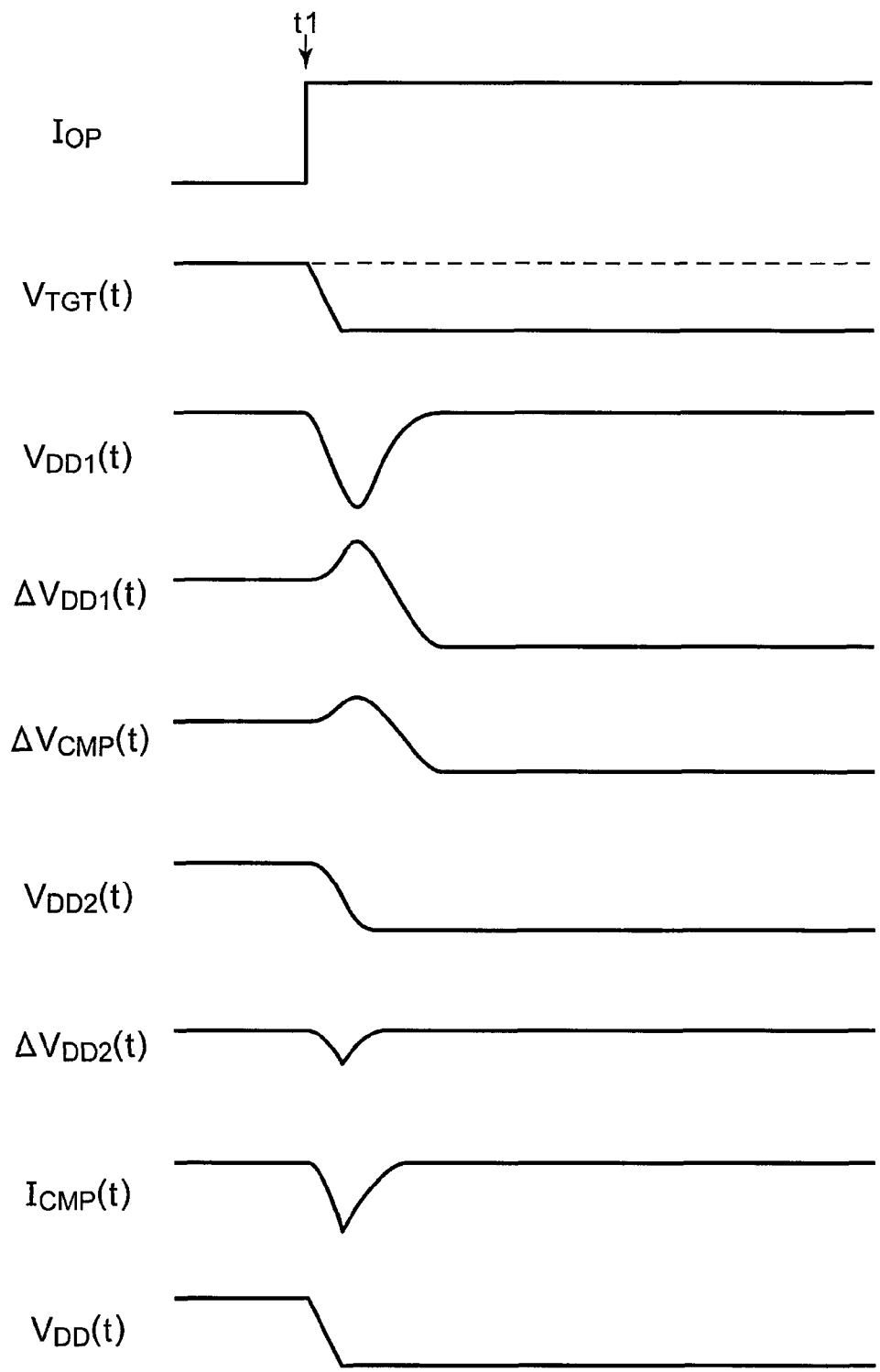
FIG. 9 is a waveform diagram showing an emulation of the power supply voltage waveform provided by the test apparatus shown in FIG. 3.

FIG. 9 is a waveform diagram showing a power supply voltage waveform emulation provided by the test apparatus 2 shown in FIG. 3.

When a certain test pattern $S_{TEST}$ is supplied to the DUT 1, the operating current $I_{OP}$ of the DUT 1 suddenly rises at the time point t1. In this case, the target waveform $V_{TGT}$ to be emulated drops according to the increase in the operating current $I_{OP}$, following which the target waveform $V_{TGT}$ is maintained at a dropped level.

The correction voltage $\Delta V_{CMP}$(t) is calculated based on the difference between the first waveform $V_{DD1}$(t) and the target waveform $V_{TGT}$(t). The correction voltage $\Delta V_{CMP}$(t) thus calculated is fed forward to the main power supply 10, thereby allowing the second waveform $V_{DD2}$(t) to be controlled such that it is closer to the target waveform $V_{TGT}$(t) than is the first waveform $V_{DD1}$(t).

Furthermore, the correction current $I_{CMP}$ is calculated based on the difference $\Delta V_{DD2}$(t) between the second waveform $V_{DD2}$(t) and the target waveform $V_{TGT}$(t), and the correction current $I_{CMP}$ is generated by means of the power supply compensation circuit 12, thereby controlling the power supply voltage $V_{DD}$(t) such that it approaches closer to the target waveform $V_{TGT}$(t).

The above is the operation of the test apparatus 2.

With the test apparatus 2 according to the embodiment, by feedforward controlling the feedback-type main power supply 10 according to the operating current $I_{OP}$ of the DUT 1 which is determined by the test pattern $S_{TEST}$, such an arrangement allows a desired power supply voltage waveform to be emulated.

Figure 1:
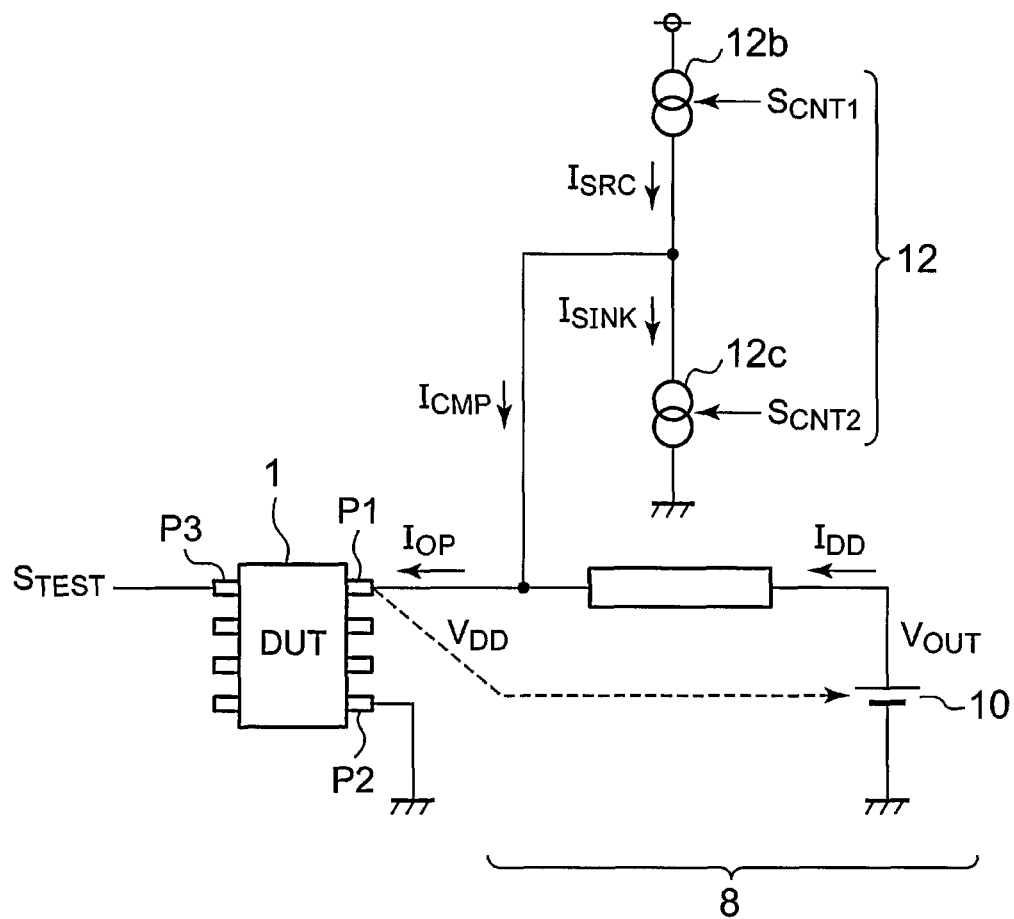
FIG. 1 is a block diagram showing a configuration of a power supply apparatus including a compensation circuit investigated by the present inventors.
Figure 2A:
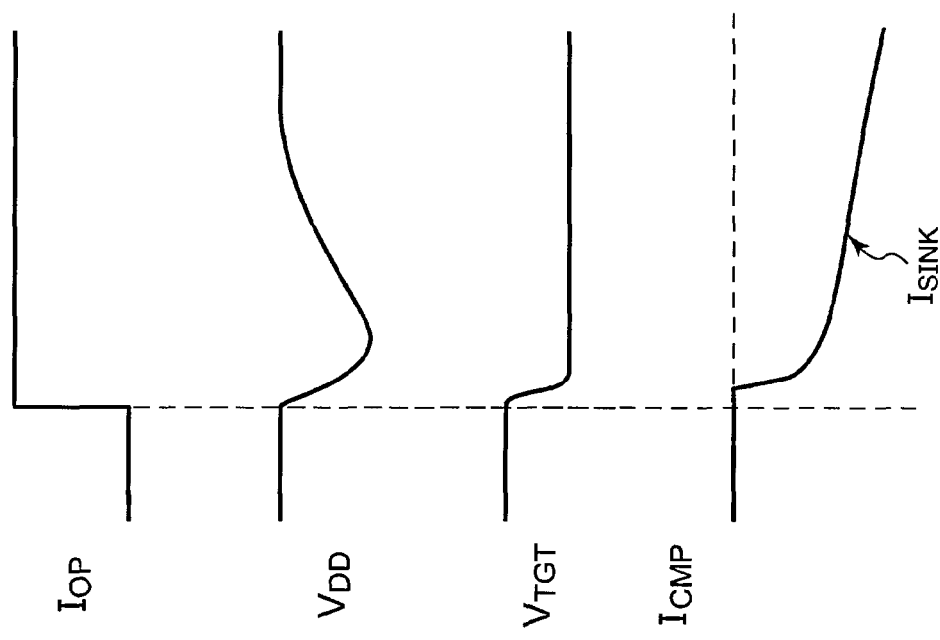
FIGS. 2A and 2B are diagrams for describing an emulation of the power supply environment.
Figure 2B:
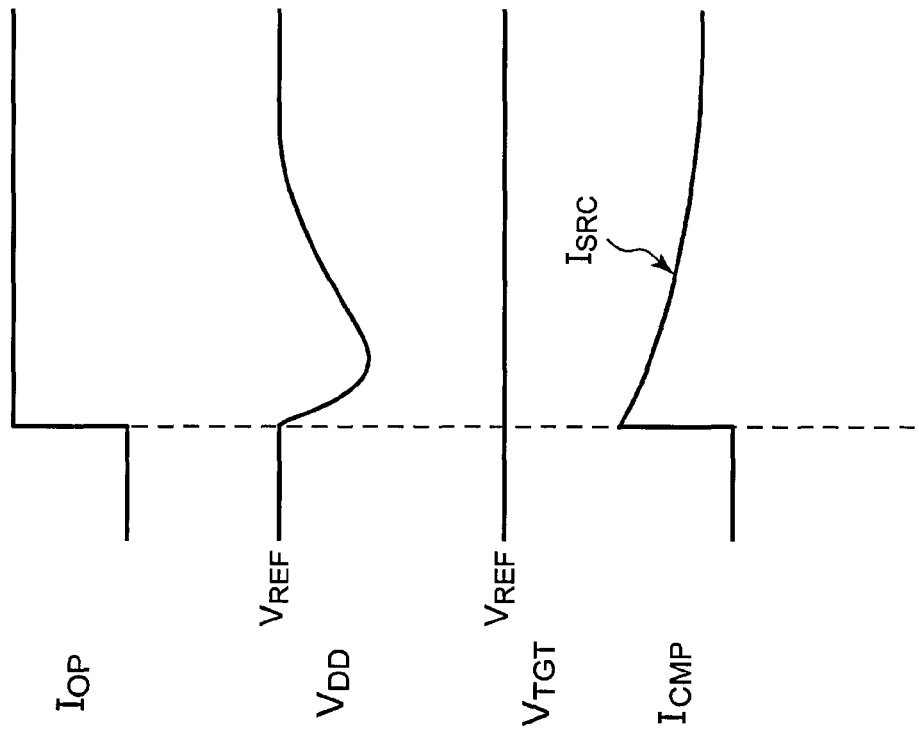

As described above with reference to FIG. 2, in a case in which such a feedforward control operation is not performed for the main power supply 10, in a case in which the level of the target waveform $V_{TGT}$(t) after transition differs from the level before transition, such an arrangement is required to generate the compensation current $I_{CMP}$ at all times, leading to a problem of large power consumption of the power supply apparatus 8. In contrast, with the test apparatus 2 according to the embodiment, the compensation current $I_{CMP}$ is generated only in a short period of time immediately after the time point t1. Furthermore, such a feedforward control operation does not require large current consumption of the main power supply 10. Thus, such an arrangement allows power consumption to be reduced as compared with an arrangement in which intentional fluctuation is applied to the power supply voltage by means of the compensation circuit alone.

Description has been made regarding the present invention with reference to the embodiments. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

Figure 10:
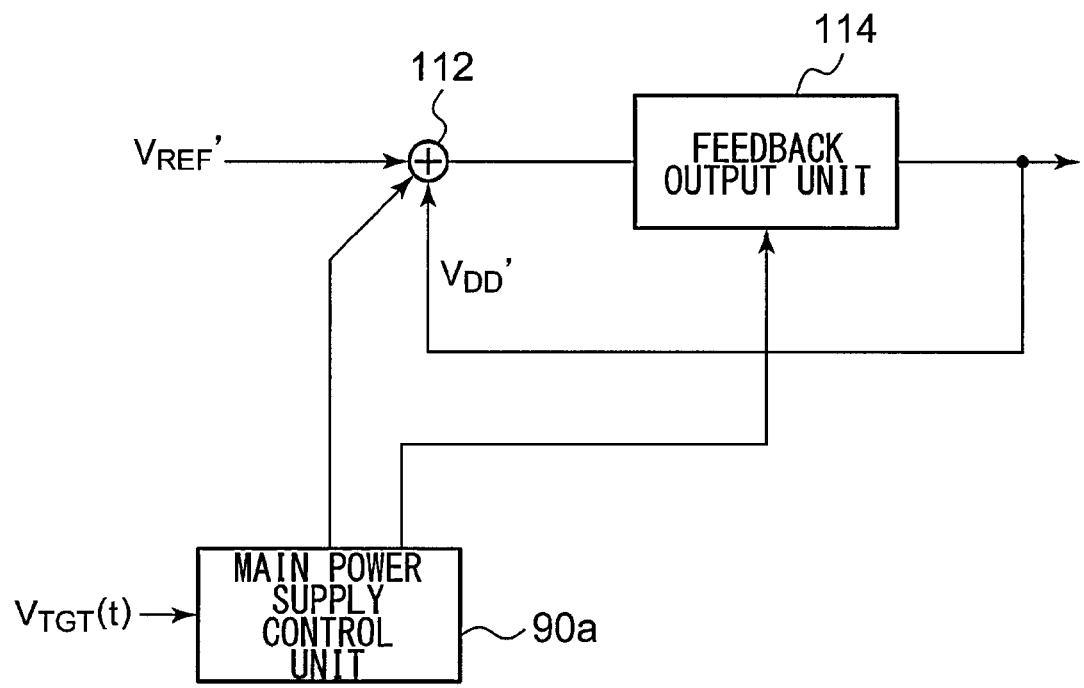
FIG. 10 is a block diagram showing a configuration of a test apparatus according to a first modification.

Description has been made above regarding a feedforward control operation in which the target value or otherwise the detection value is controlled according to the target waveform $V_{TGT}$. However, the present invention is not restricted to such an arrangement. FIG. 10 is a block diagram showing a configuration of a test apparatus 2 according to a first modification. A main power supply 10 includes an error signal generating unit 112 and a feedback output unit 114. With such a modification, at least one of the error signal generating unit 112 or the feedback output unit 114 is configured to have an adjustable transfer function. A main power supply control unit 90a is configured to control the transfer function of the error signal generating unit 112 or the transfer function of the feedback output unit 114 according to the target waveform $V_{TGT}(t)$.

For example, the main power supply 10 is configured as a switching regulator. In this case, the main power supply control unit 90a may control at least one of the switching frequency of the switching regulator, the transistor size of the switching transistor, the amplitude of the driving signal for the switching transistor (gate voltage or otherwise the base current), or the inductance of the inductor, according to the target waveform. Such an arrangement allows the transfer function of the feedback output unit 114 to be changed, thereby providing such a feedforward control operation such that the power supply voltage $V_{DD}$ approaches the target waveform $V_{TGT}(t)$. The size of the switching transistor can be changed by configuring the switching transistor such that multiple transistor units each having a gate terminal that can be switched independently are connected in parallel, and by changing the number of transistor units that are switched on and off.

Alternatively, an arrangement may be made in which the switching regulator is configured as a synchronous rectification switching regulator, and the operating mode is switched between (i) a mode in which the switching transistor and the synchronous rectification transistor are switched in a complementary manner and (ii) a mode in which the switching operation of the synchronous rectification transistor is stopped so as to cause it to function as a rectifier element (diode), and a switching operation of only the switching transistor is performed.

Also, an arrangement may be made in which multiple channels of switching regulator units are arranged in parallel, and the number of operating channels is changed. With such an arrangement, the multiple channels may be driven in phase or otherwise by multiphase driving. Such an arrangement also allows the transfer function to be controlled. Also, the phase difference between respective channels may be changed so as to control the transfer function.

The main power supply 10 may be configured as a digital control power supply. In this case, the error signal generating unit 112 includes a subtractor configured to generate the deviation between the detection value $V_{DD}'$ and the target value $V_{REF}'$. Furthermore, the feedback output unit 114 includes a digital calculation unit configured to perform at least one of P (Proportional) control, PI (Proportional Integral) control, or PID (Proportional Integral Derivative) control. The main power supply control unit 90a may control the control parameters of the digital calculation unit so as to control the transfer function.

Examples of adjustments of the control parameters include: (1) adjustment of coefficients and constants defined in the digital calculation unit; and (2) adjustment of calculation processing executed by the digital calculation unit.

With the former adjustment arrangement, the main power supply 10 may feedforward control the parameters a and b of the transfer function H(s) defined by $H(s) = b/(1+a \cdot s)$. Alternatively, the sampling frequency of the digital calculation processing may be adjusted.

Examples of the latter adjustment arrangements include switching of the filter format of the digital calculation unit. More specifically, the filter may be switched between an FIR (Finite Impulse Response) filter and an IIR (Infinite Impulse Response) filter. Alternatively, the order or the number of stages of such an FIR filter or otherwise an IIR filter may be switched.

The main power supply 10 may be configured as an analog control power supply. In this case, the error signal generating unit 112 includes an error amplifier configured to amplify the error between the detection value $V_{DD}'$ and the target value $V_{REF}'$, and a phase compensation circuit provided to the error amplifier. The main power supply control unit 90a may control at least one of the bias current of the error amplifier or the time constant of the phase compensation circuit. By adjusting the bias current of the error amplifier, such an arrangement is capable of adjusting the response speed and the offset voltage of the error amplifier.

[Second Modification]

In a case in which the second waveform $V_{DD2}(t)$ obtained only by the feedforward control operation of the main power supply 10 has sufficient accuracy so as to meet the requirements, or in a case in which the target waveform $V_{TGT}(t)$ is to be changed at a rate that can be followed by the main power supply 10, the power supply compensation circuit 12 may be omitted.

[Third Modification]

Description has been made in the embodiment regarding an arrangement in which the power supply compensation circuit 12 includes both the source current source 12b and the sink current source 12c. However, the present invention is not restricted to such an arrangement. Also, the power supply compensation circuit 12 may include the source current source 12b alone or otherwise the sink current source 12c alone. In a case in which the power supply compensation circuit 12 includes the source current source 12b alone, the power supply compensation circuit 12 instructs the source current source 12b to generate a constant current $I_{DC}$. With such an arrangement, if a shortfall occurs in the power supply current $I_{DD}$ with respect to the operating current $I_{OP}$, the current $I_{SRC}$ generated by the source current source 12b is relatively increased from the constant current $I_{DC}$. Conversely, in a case in which the power supply current $I_{DD}$ is excessive with respect to the operating current $I_{OP}$, the current $I_{SRC}$ generated by the source current source 12b is relatively reduced from the constant current $I_{DC}$.

In a case in which the power supply compensation circuit 12 may include the sink current source 12c alone, the power supply compensation circuit 12 instructs the sink current source 12c to generate a constant current $I_{DC}$. With such an arrangement, if a shortfall occurs in the power supply current $I_{DD}$ with respect to the operating current $I_{OP}$, the current $I_{SINK}$ generated by the sink current source 12c is relatively reduced from the constant current $I_{DC}$. Conversely, in a case in which the power supply current $I_{DD}$ is excessive with respect to the operating current $I_{OP}$, the current $I_{SINK}$ generated by the sink current source 12c is relatively increased from the constant current $I_{DC}$.

Such an arrangement has a disadvantage of an increase in the overall current consumption of the test apparatus, due to the amount of constant current $I_{DC}$. However, as a tradeoff, such an arrangement requires only a single switch to generate the compensation currents $I_{SRC}$ or $I_{SINK}$.

While the preferred embodiments of the present invention have been described using specific terms, such description is for illustrative purposes only, and it is to be understood that changes and variations may be made without departing from the spirit or scope of the appended claims.

What is claimed is:

1. A test apparatus configured to test a device under test, comprising:
   a test unit configured to supply a predetermined test pattern to the device under test;
   a main power supply arranged such that its output terminal is connected to a power supply terminal of the device under test via a power supply line, and is configured to feedback control an output voltage output via the output terminal such that a detection value that corresponds to a power supply voltage at the power supply terminal approaches a target value; and
   a power supply control unit configured to feedforward control the main power supply such that the power supply voltage approaches a predetermined target waveform when the test unit supplies the test pattern to the device under test,
   wherein the main power supply comprises:
   an error signal generating unit configured to generate an error signal that corresponds to an error between the detection value and the target value; and
   a feedback output unit configured to feedback control the output voltage according to the error signal such that the error becomes zero,
   and wherein the power supply control unit is configured to superimpose on the target value a correction voltage that corresponds to the target waveform, and wherein the power supply control unit comprises:
   a first waveform acquisition unit configured to acquire a first waveform, which is a waveform of the power supply voltage supplied to the device under test in a state in which the target value set for the main power supply is fixed, when the device under test operates according to the test pattern;
   a target waveform acquisition unit configured to acquire the target waveform; and
   a correction voltage calculation unit configured to calculate the correction voltage based on the differential waveform between the first waveform and the target waveform.

2. A test apparatus configured to test a device under test, comprising:
   a test unit configured to supply a predetermined test pattern to the device under test;
   a main power supply arranged such that its output terminal is connected to a power supply terminal of the device under test via a power supply line, and is configured to feedback control an output voltage output via the output terminal such that a detection value that corresponds to a power supply voltage at the power supply terminal approaches a target value; and
   a power supply control unit configured to feedforward control the main power supply such that the power supply voltage approaches a predetermined target waveform when the test unit supplies the test pattern to the device under test,
   wherein the main power supply comprises:
   an error signal generating unit configured to generate an error signal that corresponds to an error between the detection value and the target value; and
   a feedback output unit configured to feedback control the output voltage according to the error signal such that the error becomes zero,
   and wherein the power supply control unit is configured to superimpose on the detection value a correction voltage that corresponds to the target waveform, and wherein the power supply control unit comprises:
   a first waveform acquisition unit configured to acquire a first waveform, which is a waveform of the power supply voltage supplied to the device under test in a state in which the target value set for the main power supply is fixed, when the device under test operates according to the test pattern;
   a target waveform acquisition unit configured to acquire the target waveform; and
   a correction voltage calculation unit configured to calculate the correction voltage based on the differential waveform between the first waveform and the target waveform.

3. A test apparatus according to claim 1, wherein the correction voltage calculation unit is configured to generate the correction voltage by multiplying the differential waveform by a predetermined coefficient K,
   and wherein the coefficient K is represented by $V_{REF}/V_{DD}$, with $V_{REF}$ as the target value when the correction voltage is zero, and with $V_{DD}$ as the power supply voltage.

4. A test apparatus according to claim 2, wherein the correction voltage calculation unit is configured to generate the correction voltage by multiplying the differential waveform by a predetermined coefficient K, and wherein the coefficient K is represented by $V_{REF}/V_{DD}$, with $V_{REF}$ as the target value when the correction voltage is zero, and with $V_{DD}$ as the power supply voltage.

5. A test apparatus according to claim 1, wherein the correction voltage calculation unit is configured to generate the correction voltage by multiplying the differential waveform by an inverse function of a transfer function of the main power supply.

6. A test apparatus according to claim 2, wherein the correction voltage calculation unit is configured to generate the correction voltage by multiplying the differential waveform by an inverse function of a transfer function of the main power supply.

7. A test apparatus according to claim 1, wherein the correction voltage calculation unit is configured to boost a high-frequency component of the differential waveform.

8. A test apparatus according to claim 2, wherein the correction voltage calculation unit is configured to boost a high-frequency component of the differential waveform.

9. A test apparatus according to claim 1, further comprising a compensation circuit configured such that, when the device under test executes a given operation sequence in response to the test pattern, the aforementioned compensation circuit (i) injects a compensation current that corresponds to the operation sequence into the power supply terminal via a path that differs from that of the main power supply, and additionally or alternatively (ii) draws, via a path that differs from that of the device under test, the compensation current from the power supply current that flows from the main power supply to the device under test, wherein the power supply control unit further comprises:
a second waveform acquisition unit configured to acquire a second waveform, which is a waveform of the power supply voltage supplied to the device under test in a state in which the main power supply is feedforward controlled by the power supply control unit, when the device under test operates in response to the test pattern; and
a compensation current calculation unit configured to calculate the compensation current to be generated by the compensation circuit, based on the differential waveform between the second waveform and the target waveform.

10. A test apparatus according to claim 2, further comprising a compensation circuit configured such that, when the device under test executes a given operation sequence in response to the test pattern, the aforementioned compensation circuit (i) injects a compensation current that corresponds to the operation sequence into the power supply terminal via a path that differs from that of the main power supply, and additionally or alternatively (ii) draws, via a path that differs from that of the device under test, the compensation current from the power supply current that flows from the main power supply to the device under test, wherein the power supply control unit further comprises:
a second waveform acquisition unit configured to acquire a second waveform, which is a waveform of the power supply voltage supplied to the device under test in a state in which the main power supply is feedforward controlled by the power supply control unit, when the device under test operates in response to the test pattern; and
a compensation current calculation unit configured to calculate the compensation current to be generated by the compensation circuit, based on the differential waveform between the second waveform and the target waveform.

11. A test apparatus configured to test a device under test, comprising:
a test unit configured to supply a predetermined test pattern to the device under test;
a main power supply arranged such that its output terminal is connected to a power supply terminal of the device under test via a power supply line, and is configured to feedback control an output voltage output via the output terminal such that a detection value that corresponds to a power supply voltage at the power supply terminal approaches a target value; and
a power supply control unit configured to feedforward control the main power supply such that the power supply voltage approaches a predetermined target waveform when the test unit supplies the test pattern to the device under test, wherein the main power supply comprises:

an error signal generating unit configured to generate an error signal that corresponds to the error between the detection value and the target value; and
a feedback output unit configured to feedback control the output voltage according to the error signal such that the error becomes zero,
and wherein at least one from among a transfer function of the error signal generating unit and a transfer function of the feedback output unit is configured to be adjustable,
and wherein the power supply control unit is configured to control the transfer function of the error signal generating unit and the transfer function of the feedback output unit according to the target waveform.

12. A test apparatus according to claim 11, wherein the main power supply is configured as a switching regulator,
and wherein the power supply control unit is configured to control at least one from among a switching frequency of the switching regulator, a transistor size of a switching transistor, an amplitude of a driving signal to be supplied to the switching transistor, and an inductance of an inductor.

13. A test apparatus according to claim 11, wherein the main power supply is configured as a switching regulator,
and wherein the power supply control unit controls (i) a mode in which a switching transistor and a synchronous rectification transistor are switched in a complementary manner, and (ii) a mode in which a switching operation of the synchronous rectification transistor is stopped so as to cause it to operate as a rectifier element (diode), and a switching operation is performed for only the switching transistor.

14. A test apparatus according to claim 11, wherein the main power supply comprises a plurality of channels of switching regulator units connected in parallel,
and wherein the power supply control unit is configured to control at least one from among (i) the number of channels to be operated, and (ii) a phase difference in a case of multiphase driving of the respective channels.

15. A test apparatus according to claim 11, wherein the main power supply is configured as a digital control power supply,
and wherein the error signal generating unit comprises a subtractor configured to generate deviation between the detection value and the target value,
and wherein the feedback output unit comprises a digital calculation unit configured to perform any one from among P (Proportional) control, PI (Proportional Integral) control, and PID (Proportional Integral Derivative) control,
and wherein the power supply control unit is configured to control a control parameter of the digital calculation unit.

16. test apparatus according to claim 11, wherein the main power supply is configured as an analog control power supply,
and wherein the error signal generating unit comprises:
an error amplifier configured to amplify an error between the detection value and the target value; and
a phase compensation circuit provided to the error amplifier,
and wherein the power supply control unit is configured to control at least one from among a bias current of the error amplifier and a time constant of the phase compensation circuit.

* * * * *